United States Patent
Bissinger et al.

(10) Patent No.: US 6,570,896 B2
(45) Date of Patent: May 27, 2003

(54) LASER RADIATION SOURCE AND PROCESS FOR GENERATING A COHERENT TOTAL LASER RADIATION FIELD

(75) Inventors: Norbert Bissinger, Goeppingen (DE); Uwe Brauch, Stuttgart (DE); Guido Hergenhan, Stuttgart (DE); Hans Opower, Krailling (DE); Marcus Scholl, Stolberg (DE); Bernd Luecke, Stuttgart (DE); Werner Spaeth, Holzkirchen (DE)

(73) Assignees: Deutsches Zentrum fuer Luft-und Raumfahrt e.V., Bonn (DE); Osram Opto Semiconductors GmbH & Co. oHG, Regensburg (DE); Universitaet Stuttgart Institut fuer Strahlwerkzeuge, Stuttgart (DE)

( * ) Notice: Subject to any disclaimer, the term of this patent is extended or adjusted under 35 U.S.C. 154(b) by 0 days.

(21) Appl. No.: 09/874,941

(22) Filed: Jun. 5, 2001

(65) Prior Publication Data

US 2002/0048292 A1 Apr. 25, 2002

Related U.S. Application Data

(63) Continuation of application No. PCT/EP00/09820, filed on Oct. 6, 2000.

(30) Foreign Application Priority Data

Oct. 7, 1999 (DE) .......................... 199 48 353

(51) Int. Cl.[7] .............. H01S 3/10; H01S 3/13; H01S 3/00; H04B 10/04
(52) U.S. Cl. ............... 372/38.02; 372/29.02; 372/26; 372/28; 359/182; 359/184
(58) Field of Search .............. 372/38.02, 29.02, 372/26; 359/182, 184

(56) References Cited

U.S. PATENT DOCUMENTS

| | | | |
|---|---|---|---|
| 4,649,351 A | 3/1987 | Veldkamp et al. | |
| 4,933,649 A | 6/1990 | Swanson et al. | |
| 5,081,710 A | * 1/1992 | de Groot et al. | ........... 359/184 |
| 5,337,323 A | 8/1994 | Rokugawa et al. | |
| 5,363,233 A | 11/1994 | Pernick | |
| 5,814,841 A | 9/1998 | Kusuda et al. | |
| 5,864,430 A | * 1/1999 | Dickey et al. | ........... 359/559 |
| 6,157,755 A | 12/2000 | Brauch et al. | |
| 6,219,362 B1 | 4/2001 | Hillmer et al. | |
| 6,252,893 B1 | 6/2001 | Stange | |

FOREIGN PATENT DOCUMENTS

| | | |
|---|---|---|
| DE | 195 15 963 | 11/1996 |
| DE | 196 23 883 | 12/1997 |
| DE | 198 11 032 | 10/1998 |
| DE | 197 55 453 | 7/1999 |
| EP | 0 661 785 | 7/1995 |

OTHER PUBLICATIONS

Bartelt-Berger et al., "Power-scalable system of phase-locked single-mode diode lasers", Applied Optics, vol. 38, No. 27, Sep. 20, 1999, pp. 5752–5760.

(List continued on next page.)

*Primary Examiner*—Paul Ip
*Assistant Examiner*—Armando Rodriguez

(57) ABSTRACT

A laser radiation source is provided with an array of N individual slave laser diodes in a predetermined surface area. Adjustable power supply networks enable adjustment of the slave laser diodes relative to one another for operation in a stable manner. The slave power supply has a separate power supply network for each slave laser diode. Each of the power supply networks can be adjusted with respect to the current supplied to the respective slave laser diode during a certain operating period. This enables adjusting the slave laser diodes relative to one another. The power supply networks can be connected in parallel and supplied by a common source.

46 Claims, 8 Drawing Sheets

OTHER PUBLICATIONS

Hohimer et al., "Integrated injection–locked high–power cw diode laser arrays", Applied Physics Letters, vol. 55, No. 6, Aug. 7, 1989.

Hergehan et al., "Fast coherence switching of an injection–locked vertical–cavity laser array", Conference on Lasers and Electro–Optics (CLEO 2000), Technical Digest, Post Conference Edition vol. 39, 2000, pp. 100–101.

Ehbets et al., "Beam shaping of high–power laser diode arrays by continuous surface–relief elements", Journal of Modern Optics, 1993, vol. 40, No. 4, pp. 637–645.

*Patent Abstracts of Japan*, Abstract of Japanese Patent "Semiconductor Laser Array Device", Publication No. 63164287, Jul. 7, 1988, Japanese Application No. 61311400, Filed Dec. 25, 1986.

Bartelt–Berger et al., "Single–mode fiber–coupled semiconductor laser systems for direct applications", LaserOpto—31 (1)/1999 pp. 58–65.

Dasgupta et al., "Feedback stabilization of semiconductor laser arrays", Journal Optical Society of America, vol. 11, No. 2, Feb. 1994, pp. 290–296.

* cited by examiner

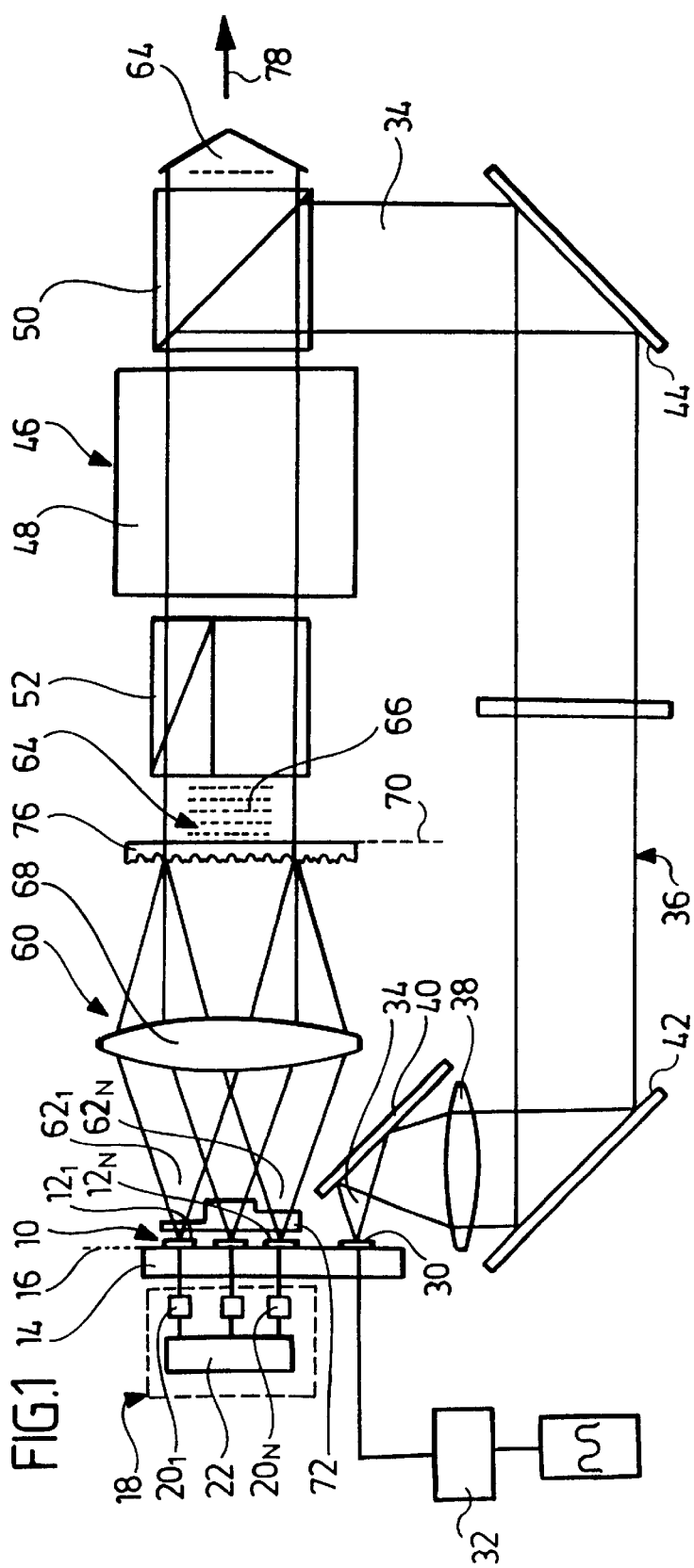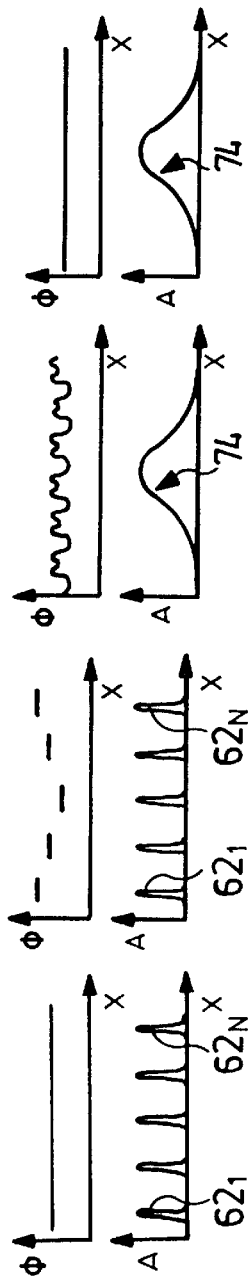

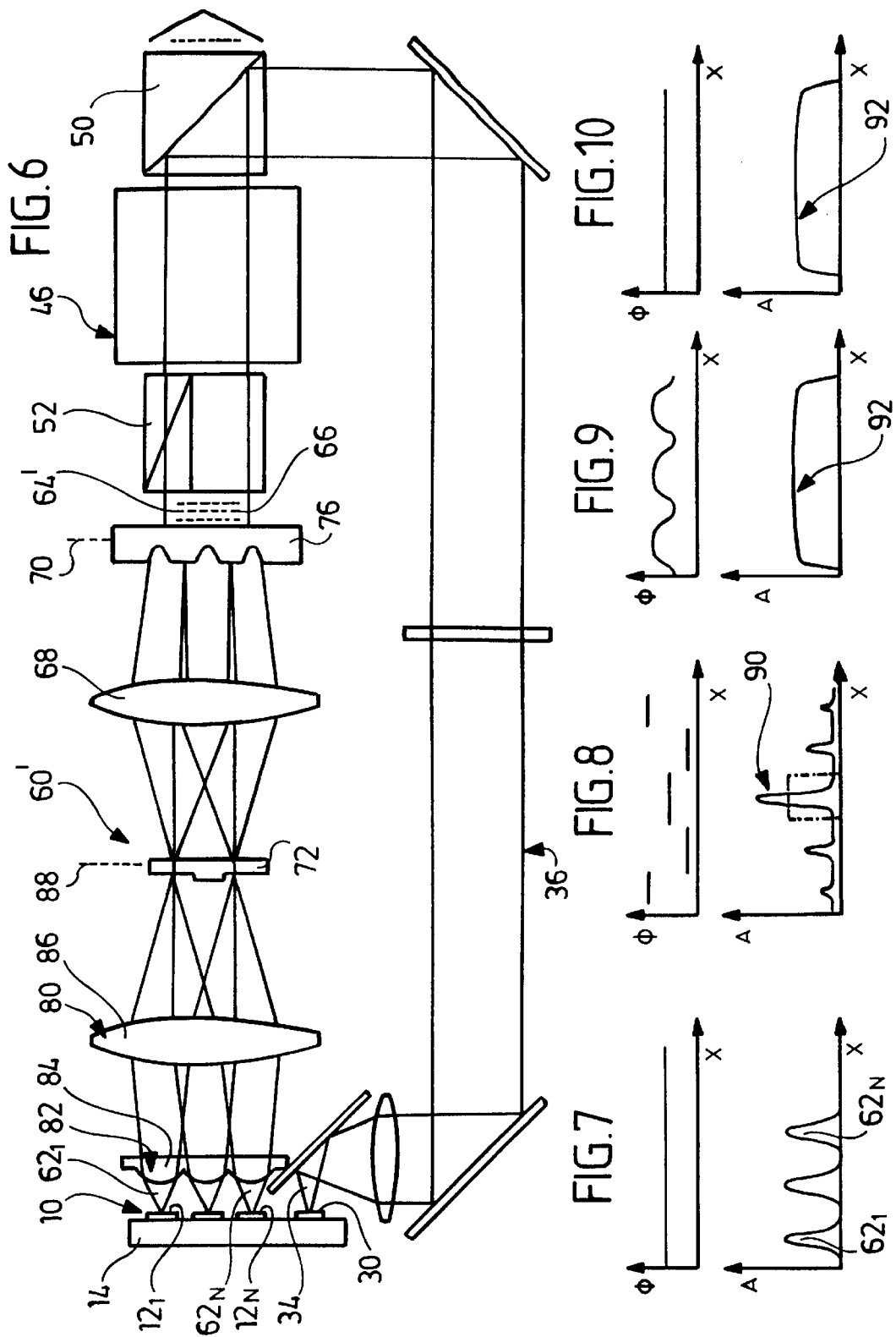

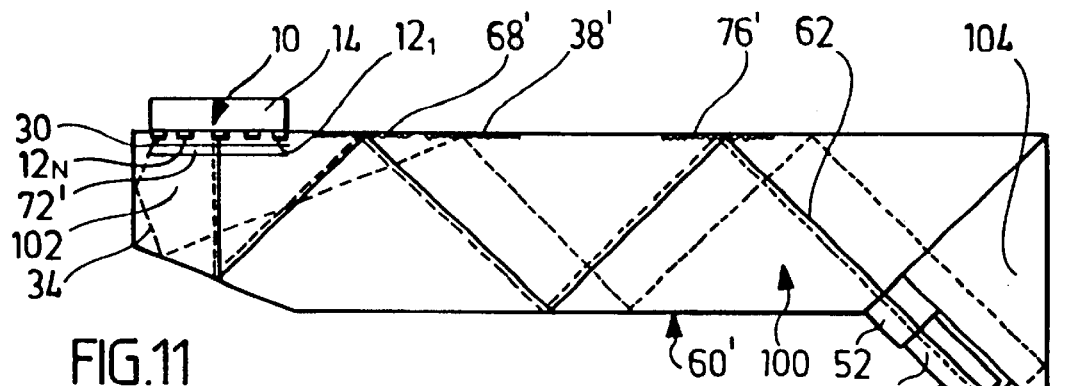
FIG. 11
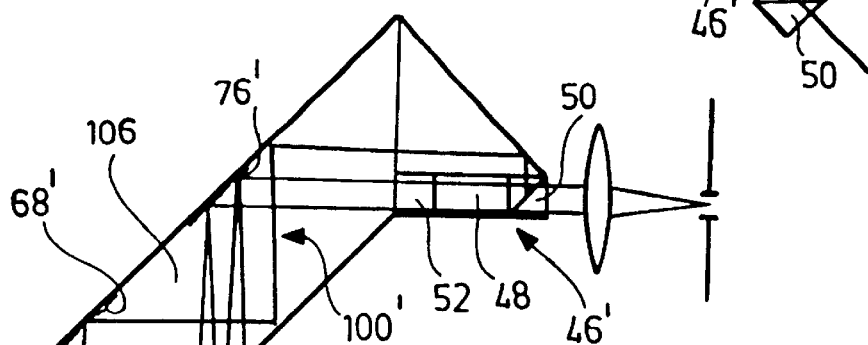
FIG. 12
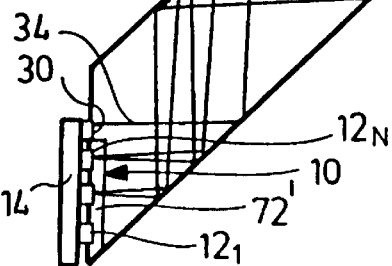
FIG. 13
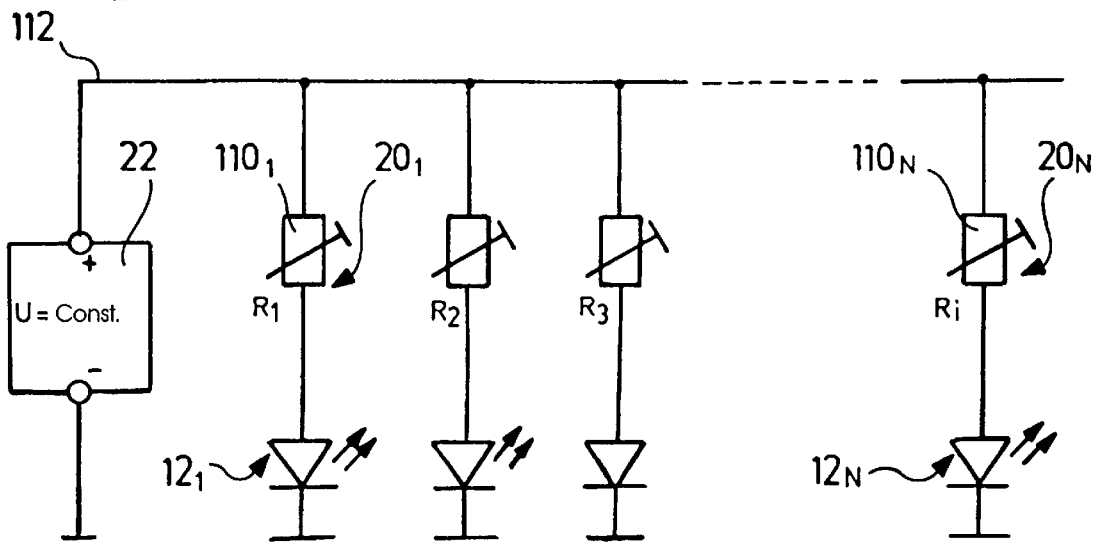

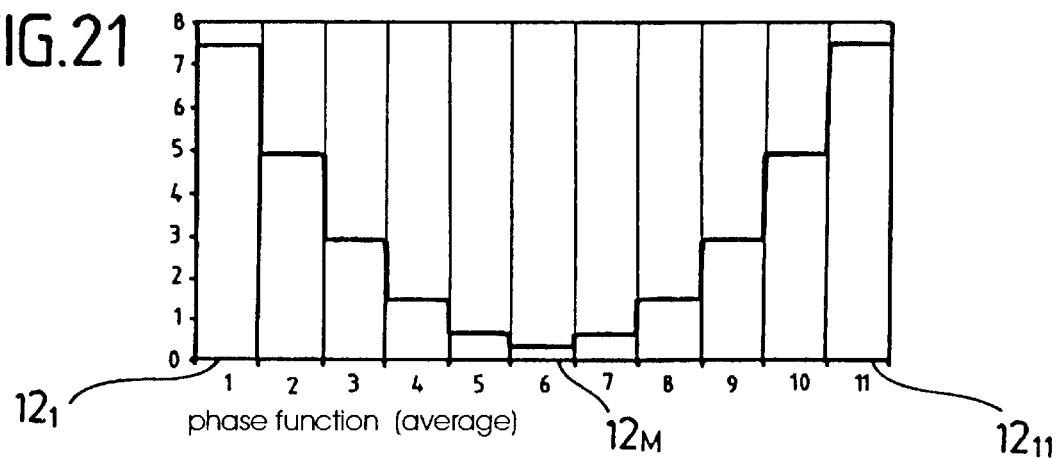
FIG. 21 phase function (average)
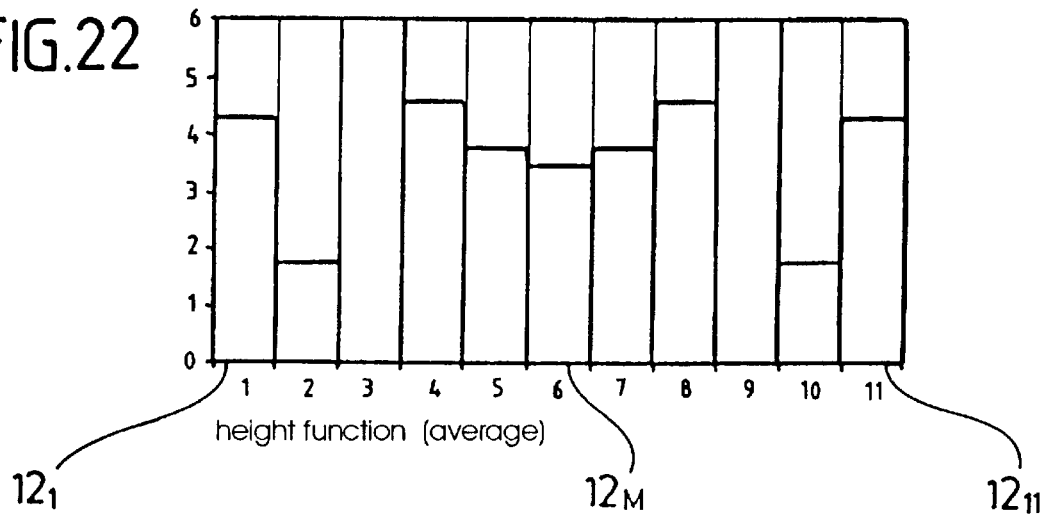
FIG. 22 height function (average)

LASER RADIATION SOURCE AND PROCESS FOR GENERATING A COHERENT TOTAL LASER RADIATION FIELD

This application is a continuation of international application number PCT/EP00/09820 filed on Oct. 6, 2000.

BACKGROUND OF THE INVENTION

The invention relates to a laser radiation source comprising an array of N individual slave laser diodes in a predetermined surface area, a slave power supply for the slave laser diodes, a master laser diode for generating a master laser radiation, a master power supply for the master laser diode, an optical coupling device, with which the master laser radiation can be coupled into the individual slave laser diodes in order to operate them at the frequency of the master laser diode in a phase-locked manner, and an optical transformation device which forms a coherent total laser radiation field with essentially defined, preferably plane wave fronts from the slave laser radiation of the individual slave laser diodes.

Laser radiation sources of this type are known from the state of the art.

In their case there is, however, the problem that the stable operation of the individual slave laser diodes is extremely complicated.

SUMMARY OF THE INVENTION

The object underlying the invention is, therefore, to improve a laser radiation source of the generic type in such a manner that the slave power supply has a separate power supply network for each slave laser diode, that each of the power supply networks can be adjusted with respect to the current supplied to the respective slave laser diode during a certain operating period for adjusting the slave laser diodes relative to one another and that the power supply networks are connected in parallel and supplied by a common source.

The advantage of the inventive solution is to be seen in the fact that it is possible, due to the adjustability of the power supply networks, for the slave laser diodes to be adjusted relative to one another and thus be operated in a stable manner in relation to one another.

At the same time, the relative stability of the operation of the individual slave laser diodes is improved further due to the fact that the power supply networks are connected in parallel and supplied by a common source since fluctuations in the supply by the common source affect all the slave laser diodes to the same degree and so the adjustment of the slave laser diodes relative to one another is not impaired.

Therefore, a possibility which is simple to realize is created by the inventive solution of adjusting an optionally large number of slave laser diodes relative to one another and of operating them in a stable manner in this adjustment relative to one another over a certain operating period.

Within the meaning of the inventive solution, it is, in this respect, possible to carry out the adjustment only for a certain operating period. For example, it would be conceivable to adjust the slave laser diodes relative to one another prior to putting them into operation each time by means of a procedure to be provided later in detail.

It is, however, even better when the slave laser diodes have to be readjusted relative to one another only at certain intervals, i.e. longer operating periods, so that the complicated adjustment of the slave laser diodes relative to one another can be omitted each time they are put into operation.

It is, however, particularly favorable when the slave laser diodes are adjusted relative to one another in that each of the power supply networks can be adjusted one time.

Such a one-time adjustability of a power supply network is known from circuit technology as a result of manifold solutions. For example, it is known to trim complex circuits one time so that these subsequently operate in accordance with the one-time trimming.

In principle, it is conceivable to construct the power supply networks in an optionally complex manner since complex circuit networks can also be produced in large numbers and in a simple manner with a modern design of electronic circuits. For example, it would be conceivable to design the power supply networks with adjustable current stabilizing circuits with the use of semiconductor components.

It is, however, particularly favorable when each of the power supply networks is a resistance network since a resistance network is, on the one hand, inexpensive to construct and, on the other hand, can be adjusted in a very simple manner.

A particularly favorable solution provides for each of the power supply networks to have a resistor adjustable due to alteration of its cross section.

In principle, it would also be conceivable to design the resistance network in such a manner that the adjustable resistor represents a parasitic current drain which is connected in parallel to the respective slave laser diode.

It is, however, particularly favorable with respect to the power consumption when each of the power supply networks has an adjustable resistor connected in series with the respective slave laser diode since, as a result, the current can be influenced in a direct manner by the slave laser diode and, in addition, the current consumption can be minimized.

The power supply networks could, in principle, be supplied by an optional common source. A particularly favorable solution provides for all the power supply networks to be supplied by a common voltage source so that the power supply networks can, in particular, be designed as simple resistance networks, with which the current can be determined in a simple manner by varying the resistance.

The common voltage source is preferably a voltage-stabilized voltage source so that fluctuations in the voltage can be avoided to a great extent and thus an additional stabilization of the adjustment of the slave laser diodes relative to one another can be achieved.

In principle, it would be conceivable to design the power supply of the master laser diode in accordance with the slave power supply and, for example, to likewise supply the slave power supply via the common source.

It is, however, particularly favorable with respect to the degrees of freedom of the adjustment of the master laser diode relative to the slave laser diodes when the slave power supply operates independently of the master power supply so that a completely independent operation of the master laser diode is possible.

In this respect, it is particularly expedient when the master power supply can be controlled with respect to the current through the master laser diode and thus a controlled modulation of the master laser radiation can, for example, be realized.

For example, it would also be possible by way of a controlled modulation of the master laser diode to modulate the intensity of the total laser radiation field, namely when the modulation of the master laser diode is carried out to such an extent that this no longer operates the slave laser diodes in a coupled manner.

As a result, it is possible, for example, in a simple manner and with a slight variation in the current to obtain a large modulation depth in the intensity of the total laser radiation field and thus to connect a large optical power even with a small current, wherein a quick connection of the large optical power is possible on account of the short response times in the interaction between the master laser radiation and the slave laser diodes.

In order to be able to design the operation of the slave laser diodes relative to one another to be as stable as possible it is preferably provided for all the slave laser diodes to be arranged on a common support.

It is particularly favorable for the production of the slave laser diodes when the common support for the slave laser diodes is a substrate, on which the slave laser diodes are installed during their production.

In principle, it would be conceivable to contact each individual slave laser diode with an electrical line for the power supply, similar to the procedure known from semiconductor technology of bonding semiconductors. It is, however, particularly favorable for realizing the power supply to the slave laser diodes when the power supply of the slave laser diodes is brought about by way of path conductors extending on the support.

For example, it would be conceivable in this respect, in the case of a two-dimensional array of slave laser diodes on one side of the substrate, to connect the slave laser diodes of one row to a common path conductor and on the opposite side of the substrate to connect rows of slave laser diodes extending transversely thereto to a common path conductor extending transversely to the first path conductor so that a so-called matrix activation of the slave laser diodes would be possible.

It is, however, particularly simple when all the slave laser diodes of an array on one side are connected to a common path conductor and on the opposite side are supplied by the respective power supply network.

In this respect, it is preferably provided for reasons of as simple a producibility as possible for the power supply networks for the slave laser diodes to be arranged on the support.

For example, it could be provided for the power supply networks to be positioned next to the array of slave laser diodes and for each of the power supply networks to be connected to the corresponding slave laser diode by a suitable path conductor.

It is, however, even more advantageous when a power supply network arranged on the support in the area of the respective slave laser diode is associated with each slave laser diode so that, for example, the power supply network is arranged in the immediate vicinity of the respective slave laser diode and thus all the power supply networks can, on the other hand, be supplied via the common source by way of common path conductors connecting all the power supply networks to one another.

In this respect, it is particularly favorable when the power supply network has conductor sections which are arranged on the support and can be adjusted with respect to their resistance since these can be arranged in a space-saving manner so that it is possible to provide the respective power supply network in the area of the respective slave laser diode and, on the other hand, can be adjusted in a simple manner.

In this respect it would, for example, be conceivable to provide a material variation for the adjustment. It is, however, particularly favorable when the conductor sections can be adjusted by way of variation of a cross section thereof, wherein a removal of material is also conceivable, for example, for the cross-sectional variation.

A variation in the cross section of a conductor section for the adjustment of the resistance is to be understood not only as a reduction in the cross section but also an increase in the cross section as well as the connection of two sections of a path conductor which are, first of all, interrupted for the purpose of decreasing the resistance.

A particularly favorable technology provides for each of the power supply networks to be adjustable by way of laser trimming since, as a result, an adjustment of the individual power supply networks relative to one another is possible in a particularly simple and inexpensive manner.

With respect to the adjustment of the slave laser diodes relative to one another, no further details have so far been given. One decisive criterion is the possibility of adjusting the slave laser diodes such that the slave laser radiations are superimposed coherently to form the total laser radiation field.

In this respect it is particularly favorable when each slave laser diode is designed such that a resonator frequency of the slave laser diode can be adjusted by adjusting the current in order to set the operating range of the slave laser diode such that this operates at the frequency of the master laser radiation.

In addition, a critical parameter for the adjustment of the slave laser diodes relative to one another is the phase relationship of the slave laser radiation.

For this reason, it is particularly favorable when a phase relationship of the slave laser radiation of each slave laser diode relative to the phase of the master laser radiation can be adjusted by adjusting the current.

With this solution there is the great advantage that the slave laser diodes will not only be operated relative to one another at the same frequency and in a phase-locked manner due to the master laser diode but there is also the possibility of adjusting the individual slave laser diodes in their phase relationship to the master laser radiation, in addition to the phase-locked operation, and thus, for example, of compensating for phase differences caused by different optical wavelengths so that the slave laser radiations are actually superimposed in phase to form the coherent total laser radiation field.

With respect to the arrangement of the individual slave laser diodes, no further details have so far been given. It would, for example, be conceivable to arrange the slave laser diodes as desired, also, for example, in a row.

It is, however, particularly advantageous when the slave laser diodes are arranged in a two-dimensional array.

Such a two-dimensional array could still be an irregular pattern. It is, however, particularly favorable when the slave laser diodes are arranged in the two-dimensional array in a regular pastern in order to be able, in particular, to also design and adjust the optical transformation device accordingly.

Such a two-dimensional array could be designed in such a manner that it still has an elongated shaped.

In order to be able to utilize the optical components particularly advantageously and, in particular, to obtain as favorable a spatial distribution of intensity as possible in the coherent total laser radiation field, it is preferably provided for the two-dimensional array to have an extension of approximately the same order of magnitude in each dimension.

The two-dimensional array is preferably such that it has essentially the same order of magnitude in each dimension.

With respect to the arrangement of the slave laser diodes and the master laser diode relative to one another, no further details have been given in conjunction with the preceding explanations concerning the individual embodiments of the invention. It would, for example, be conceivable to provide the master laser diode completely separately from the slave laser diodes since, theoretically, the optical coupling of the master laser diode to the slave laser diodes is sufficient.

However, in order to be able to operate the master laser diode in a similar manner to the slave laser diodes with respect to the environmental conditions, in particular, the temperature conditions and also in order to be able to produce the master laser diode in as similar a manner as possible to the slave laser diodes with respect to its overall specifications it is preferably provided for the slave laser diodes and the master laser diode to be seated on the same support. It is even more advantageous when the slave laser diodes and the master laser diode are seated on the same substrate.

A particularly favorable laser diode provides for one of the laser diodes of a continuous array of laser diodes to represent the master laser diode and the other laser diodes to operate as slave laser diodes. This means that first of all an array of laser diodes is produced which are as identical as possible, one of the laser diodes is selected as master laser diode and the remaining laser diodes are then operated as slave laser diodes.

With respect to the design of the laser diodes themselves, no specific details have been given in conjunction with the preceding explanations concerning the inventive solution. It would, in principle, be conceivable to use so-called edge emitters as laser diodes.

However, since such edge emitters may preferably be inexpensively produced only together as one-dimensional arrangements and therefore two-dimensional arrangements of edge emitters would entail a more complicated production procedure, it is preferably provided for the laser diodes to be arranged on a single, continuous substrate as vertical emitters.

Vertical emitters of this type, or also called VCSELs, may be constructed in a particularly simple manner on a common substrate by way of known production processes, wherein the structure is produced, for example, by way of implantation, by way of mesa etching or by way of mesa etching and oxidation of the current diaphragm.

Furthermore, such vertical emitters have the advantage that they may be contacted in a simple manner since a common contacting of all the vertical emitters may be brought about via the substrate and, as for the rest, each individual vertical emitter may likewise be contacted selectively on its outlet side for the laser radiation in a simple manner.

Such a two-dimensional arrangement of vertical emitters thus creates the possibility of providing path conductors for the power supply in the areas between the vertical emitters and the corresponding power supply network, for example, in the form of adjustable resistors associated with each respective vertical emitter.

No details have been given in conjunction with the preceding explanations concerning the individual embodiments as to how the optical transformation device is intended to be designed.

The optical transformation device can, in principle, be of any optional design as long as the total laser radiation field can be formed with it from the slave laser radiations.

It is conceivable, for example, for the optical transformation device to comprise a microlens array. In this respect, it is preferably sufficient in the simplest case when the optical transformation device exclusively comprises a microlens array.

The optical transformation device can, however, be designed, in addition, as a complex optical device, into which a microlens array can, for example, likewise be integrated.

One advantageous solution of an optical transformation device provides for this to have a phase plate which alters the phase of the slave laser radiation in such a manner that a defined distribution of intensity results in an additional plane and for the optical transformation device to comprise in the additional plane a phase corrector plate which is adjusted to the first phase plate and leads to a defined wave front in the exiting total laser radiation field.

A defined wave front of this type can, in principle, have the most varied of shapes; it is particularly advantageous when the defined wave front is an essentially plane wave front.

A particularly expedient solution provides for the optical transformation device to have a phase plate which gives each slave laser radiation of a slave laser diode a different phase and for the optical transformation device to comprise a Fourier optical device, in the Fourier plane of which a phase corrector plate is arranged which is adjusted to the first phase plate and again conveys the same phase to the slave laser radiations having different phases and thus leads to the defined, plane wave front in the exiting total laser radiation field.

With such an optical transformation device, an essentially uniform, spatial distribution of intensity may, on the one hand, be created in the total laser radiation field with plane wave fronts, wherein the essentially uniform distribution of intensity can, for example, be a distribution of intensity similar to a Gaussian profile or a so-called flat top profile.

In principle, the phase plate can be designed such that it conveys to the various slave laser radiations a statistical phase shift relative to one another.

It is, however, particularly favorable for achieving as high an intensity as possible at as uniform a spatial distribution of intensity as possible when the phase plate effects a phase shift determined by an algorithm between the slave laser radiations of different slave laser diodes.

One particularly advantageous algorithm provides for the phase plate to effect a phase relationship varying in the same manner in all directions proceeding from a center point.

A particularly favorable embodiment provides for the variation in the phase relationship in all directions to be brought about in accordance with a monotonic analytical function.

No further details have so far been given with respect to the relationship between the optical coupling device and the optical transformation device. It would, for example, be conceivable to design the optical coupling device completely independently of the optical transformation device and thus configure the coupling completely independently of the optical transformation device.

One particularly favorable solution provides for the optical coupling device to couple the master laser radiation into the slave laser diodes via the optical transformation device. As a result, the possibility is created of coupling the master laser radiation into the individual slave laser diodes in a simple and efficient manner.

In this respect, it is preferably provided for the master laser radiation to pass through not only the phase corrector plate but also the phase plate.

With respect to realizing the optical transformation device, it would, in principle, be conceivable to construct this in a known manner in individual optical components, for example, lenses and phase plates.

A particularly favorable solution for a commercial realization provides for the optical transformation device to be integrated in a coherent block since such a coherent block is, in particular, insensitive to adjustment and can also be produced in large numbers in a simple manner.

In this respect, it is preferably provided for the elements of the optical transformation device to be designed as elements of diffractive optics, i.e. not only the lenses but also the phase plates are elements of diffractive optics which may be realized in the respective surfaces of the coherent block, for example, by way of etching methods.

In this respect, it is particularly favorable when the optical coupling device is also integrated into the coherent block.

In addition, the object specified at the outset is accomplished in accordance with the invention, in a process for operating a laser radiation source comprising an array of N individual slave laser diodes, a master laser diode for generating a master laser radiation, an optical coupling device, with which the master laser radiation is coupled into the individual slave laser diodes in order to operate them at the frequency of the master laser diode in a phase-locked manner, and an optical transformation device, with which a coherent total laser radiation field with essentially defined wave fronts is formed from the slave laser radiation of the individual slave laser diodes, in that the current supplied to each individual slave laser diode during a certain operating period is adjusted individually for adjusting the slave laser diodes relative to one another such that the slave laser radiations are superimposed coherently in the total laser radiation field with the same phase.

The advantage of the inventive process is to be seen in the fact that with it a simple possibility of adjusting the slave laser diodes relative to one another is made available for the first time in order to be able to superimpose the slave laser radiations in the total laser radiation field coherently since only an adjustment of the current supplied to each individual slave laser diode is sufficient to bring about the coherent superposition of the slave laser radiations to form the total laser radiation field.

The term "adjustment" is to be understood in this respect as an adjustment for operating periods to be respectively determined. Operating period is to be understood, for example, as the duration of the respective operation of the slave laser diodes from a one-time switching on until a switching off. However, an operating period is also to be understood as a longer operating period, for example, of days, months or years, for which a one-time adjustment is sufficient.

It is particularly advantageous when the current for each individual slave laser diode is adjusted one time so that all the slave laser diodes are adjusted relative to one another during their entire service life as a result of a one-time adjustment.

In principle, it would be conceivable within the scope of the inventive solution to operate the master laser diode coupled to the slave laser diodes, i.e. also adjusted relative to them. It is, however, particularly favorable when the slave laser diodes are operated independently of the master laser diode since it is then possible to adjust the master laser diode to the slave laser diodes in an optimum manner.

A particularly favorable solution provides for the total laser radiation field to be modulatable with the master laser diode.

In this respect, it would be conceivable, on the one hand, to modulate the master laser radiation optically, for example, as a result of beam interruption or beam attenuation or rotation of polarization. It is, however, particularly favorable when the master laser radiation can be modulated by way of the current supplied to the master laser diode since, as a result, such a modulation of the master laser radiation which effects a decoupling of the slave laser diodes from the master laser diode is possible due to a small current alteration and so the slave laser diodes no longer operate in a frequency-locked and phase-locked manner and therefore the coherent superposition of the slave laser radiations to form the total laser radiation field breaks down and so, in the long run, a small current modulation leads to an essentially complete modulation of the intensity of the total laser radiation field.

With respect to the operation of the individual slave laser diodes, no specific details have been given in conjunction with the preceding explanations concerning the individual embodiments. It is particularly advantageous, in order to maintain the adjustment of the slave laser diodes relative to one another, when all the slave laser diodes are operated under identical temperature conditions, for example, are arranged on a common support or substrate and attemperated by this.

It is also particularly favorable when the slave laser diodes and the master laser diode are operated under essentially identical temperature conditions so that drifts of the master laser diode relative to the slave laser diodes triggered by temperature are also avoided.

With respect to the design of the slave laser diodes, it has proven to be particularly favorable when each of the slave laser diodes is designed with respect to its operating range as a slave laser diode such that a resonance frequency of the slave laser diode is adjusted by way of adjustment of the current. As a result, it is possible due to the adjustment of the current to alter the resonance frequency of the respective slave laser diode and thus adjust this with respect to the frequency of the master laser radiation, as well.

It is particularly advantageous when a phase relationship of the slave laser radiation of each slave laser diode relative to the master laser radiation is adjusted by way of adjustment of the current since, as a result, it is possible to adjust the phase of the respective slave laser diode individually such that in the total laser radiation field the slave laser radiations of all the slave laser diodes can be superimposed in phase.

BRIEF DESCRIPTION OF THE DRAWINGS

Additional features and advantages of the inventive solution are the subject matter of the following description as well as the drawings illustrating several embodiments. In the drawings:

FIG. 1 shows a schematic illustration of a first embodiment of an inventive laser radiation source;

FIG. 2 shows a schematic illustration of spatial distribution of intensity and phase relationship of the slave laser radiations at the location of the slave laser diode;

FIG. 3 shows a schematic illustration of spatial distribution of intensity and phase relationship of the slave laser radiations after passing through a first phase plate;

FIG. 4 shows a schematic illustration of spatial distribution of intensity and phase relationship of the slave laser radiations in the Fourier plane prior to entering a phase corrector plate; and FIG. 5 shows a schematic illustration of spatial distribution of intensity and phase relationship of the slave laser radiations in the total laser radiation field after passing through the phase corrector plate;

FIG. 6 shows a second embodiment of an inventive laser radiation source;

FIG. 7 shows a schematic illustration of spatial distribution of intensity and phase relationship of the slave laser radiations at the location of the slave laser diodes;

FIG. 8 shows a schematic illustration of spatial distribution of intensity and phase relationship of the slave laser radiations after passing through the phase plate;

FIG. 9 shows a schematic illustration of spatial distribution of intensity and phase relationship of the slave laser radiations prior to entering the phase corrector plate; and FIG. 10 shows a schematic illustration of spatial distribution of intensity and phase relationship of the slave laser radiations after passing through the phase corrector plate;

FIG. 11 shows a third embodiment of an inventive laser radiation source;

FIG. 12 shows a fourth embodiment of an inventive laser radiation source;

FIG. 13 shows a schematic illustration of a circuit of individual power supply networks for the individual slave laser diodes;

FIG. 21 shows a schematic illustration of a phase relationship between slave laser radiations following one another in one direction and FIG. 22 shows a schematic illustration of thickness ratios of a phase plate in the case of the phase relationship illustrated in FIG. 21.

DETAILED DESCRIPTION OF THE INVENTION

Figure 14:
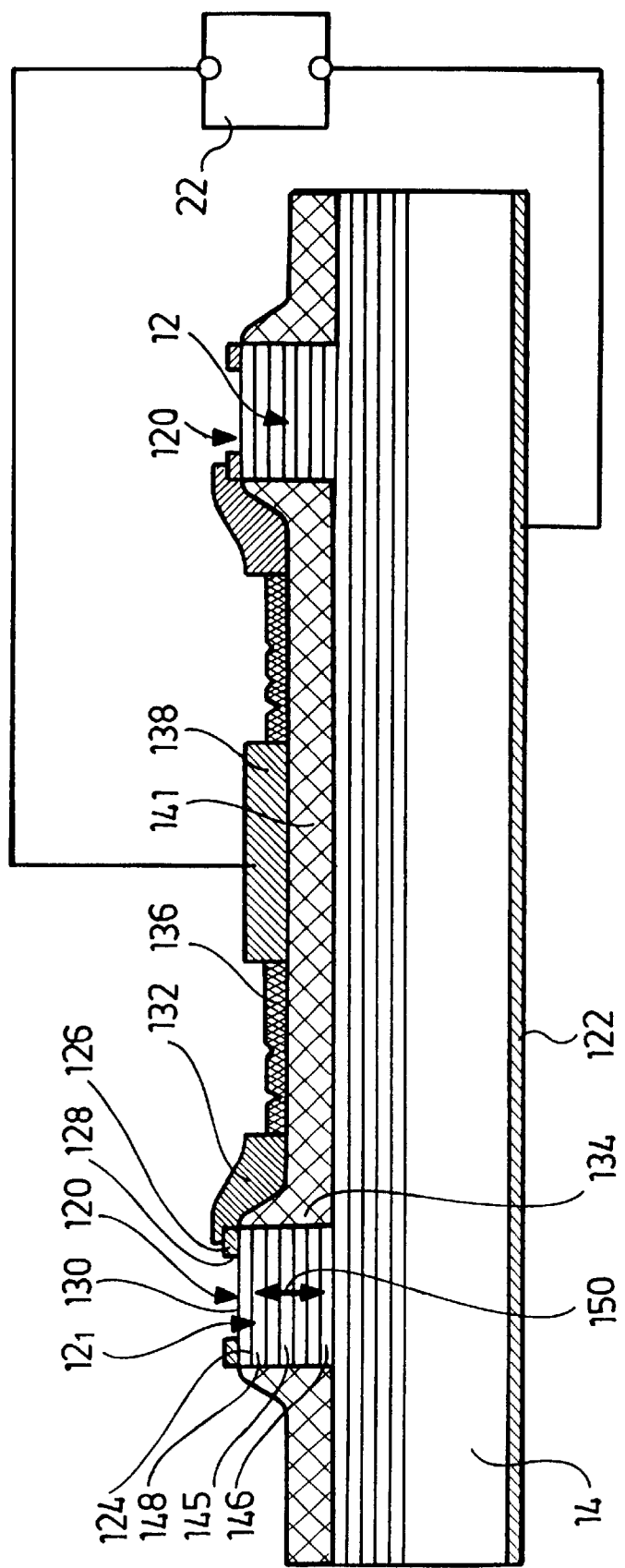
FIG. 14 shows an enlarged section of a detail through a substrate with vertical emitters as slave laser diodes.

A first embodiment of an inventive laser radiation source illustrated schematically in FIG. 1 comprises a two-dimensional array, designated as a whole as 10, of slave laser diodes $12_1$ to $12_N$ which are preferably arranged on a common substrate 14 and thereby located in a common plane 16.

All these slave laser diodes $12_1$ to $12_N$ can be operated by a common slave power supply 18, wherein the slave power supply 18 has a separate power supply network $20_1$ to $20_N$ for each of the slave laser diodes $12_1$ to $12_N$.

All the power supply networks $20_1$ to $20_N$ are connected in parallel and supplied by a single voltage source 22.

In addition, a master laser diode 30 is also provided on the substrate 14 and this can be operated by means of a master power supply 32.

The master laser diode emits a master laser radiation 34 which is coupled into all the slave laser diodes $12_1$ to $12_N$ by means of an optical coupling device 36, comprising an optical collimation device 38, deflection mirrors 40, 42 and 44 as well as a decoupling element 46, formed from a Faraday rotator 48 and polarization prisms 50 and 52 arranged on both sides thereof, as well as an optical transformation device designated as a whole as 60 so that all the slave laser diodes $12_1$ to $12_N$ operate with the same wavelength as the master laser radiation 34 and in a phase-locked manner with it.

All the slave laser diodes $12_1$ to $12_N$ each emit a slave laser radiation $62_1$ to $62_N$ which is transformed by the optical transformation device 60 into a total laser radiation 64 with wave fronts 66 which are defined in far-field proximity and are preferably essentially plane.

For this purpose, a Fourier optical device 68 is provided which is arranged at a distance from the plane 16 corresponding to the focal distance F and the slave laser radiations $62_1$ to $62_N$ of all the slave laser diodes $12_1$ to $12_N$ are imaged into a Fourier plane 70 which is arranged in spaced relationship with the focal distance F on the side of the Fourier optical device 68 located opposite the plane 16.

If all the slave laser diodes $12_1$ to $12_N$ now operate at the same wavelength, thereby emitting the slave laser radiations $62_1$ to $62_N$, all these slave laser radiations theoretically have the same phase relationship relative to one another when exiting from the slave laser diodes $12_1$ to $12_N$, as illustrated schematically in FIG. 2 over a space coordinate X.

In order to obtain, in the Fourier plane 70, an approximately Gaussian-shaped superposition of all the slave laser radiations $62_1$ to $62_N$, the slave laser radiations $62_1$ to $62_N$ are given a different phase relationship relative to one another immediately after exiting from the individual slave laser diodes $12_1$ to $12_N$ by means of a phase plate 72, as illustrated in FIG. 3.

As a result of the different phase relationships relative to one another, a distribution of the intensity A which is essentially Gaussian-shaped over the space coordinate X results in the Fourier plane 70, as illustrated in FIG. 4, due to superposition of all the slave laser radiations $62_1$ to $62_N$ which have a low intensity modulation on account of the different phase relationships. However, the phase relationship varies, as likewise illustrated in FIG. 4, over the space coordinate despite the Gaussian-shaped distribution of intensity.

In order to compensate for these different phase relationships, the phase corrector plate 76 is provided in the Fourier plane 70 and this, as illustrated in FIG. 5, sees to it that after the slave laser radiations $62_1$ to $62_N$ have passed through they again have the same phase relationship relative to one another, as illustrated in FIG. 5, in addition to the Gaussian-shaped distribution of intensity 74 so that all the slave laser radiations $62_1$ to $62_N$ are superimposed coherently with the same phase relationship to form the total laser radiation field 64 with the wave fronts 66 which are essentially plane in the far field.

The decoupling element 46 now causes this laser radiation field 64 to experience such a rotation of the plane of polarization that this passes without any outcoupling through the polarization prism 50, by means of which the master laser radiation 34 is coupled in transversely to the direction of propagation 78 of the total laser radiation field 64 and passes through the decoupling element 46 contrary to the direction of propagation 78 in the direction of the array 10 of slave laser diodes $12_1$ to $12_N$.

A more detailed description of the generation of the total laser radiation field 64 by means of the optical transformation device 70 results from the article of P. EHBETS, H. P. HERZIG, R. DAENDLIKER, P. REGNAULT and I. KJELBERG entitled "Beam shaping of high-power laser diode arrays of continuous surface-relief elements" in the Journal of Modern Optics, 1993, Volume 40, No. 4, pages 637–645, to which reference is made in full.

In a second embodiment of an inventive laser radiation source, illustrated in FIG. 6, those elements which are identical to those of the first embodiment are given the same reference numerals and so with respect to the description thereof reference can be made in full to the comments on the first embodiment.

In contrast to the first embodiment, the optical transformation device 60' comprises not only the Fourier optical device 68 with the phase plate 72 and the phase corrector plate 76 but also an intermediate optical device 80 which is preconnected to it and has a set 82 of individual lenses 84 which are associated with the slave laser diodes 12 and collimate the respective slave laser radiation $62_1$ to $62_N$ individually. An optical device 86 arranged thereafter superimposes, for its part, all the slave laser radiations $62_1$ to $62_N$ with one another in a plane 88. Proceeding from the slave laser radiations $62_1$ to $62_N$ illustrated in FIG. 7 and exiting from the slave laser diodes $12_1$ to $12_N$ with a phase relationship theoretically equal to one another, this results in a distribution of intensity 90 varying with the space coordinate X (FIG. 8).

Since the phase plate 72 is arranged in the plane of imaging 88, this gives the individual intensity maximums a different phase relationship and so in the plane 70, in which the phase corrector plate 76 is arranged, a so-called flat top profile 92 of the intensity A results in relation to the spatial distribution, but, on the other hand, with a varying phase relationship, as illustrated in FIG. 9. This varying phase relationship is compensated for by the phase corrector plate 76 so that, altogether, the total radiation field 64', as illustrated in FIG. 10, has a phase relationship of the individual slave laser radiations $62_1$ to $62_N$ which is identical relative to one another and the distribution of intensity has the shape of the flat top profile 92 so that all these slave laser radiations $62_1$ to $62_N$ are superimposed coherently and form the total laser radiation field 64' with wave fronts 66 which are plane in the far field.

In a third embodiment of an inventive laser radiation source, illustrated in FIG. 11, the optical coupling device 36 with the optical transformation device 60, constructed, for example, in accordance with the first embodiment illustrated schematically in FIG. 1 in a conventional construction, is integrated into a common block 100 which advantageously forms a unit.

The array 10 of individual slave laser diodes $12_1$ to $12_N$ and the master laser diode 30 is provided at an end region 102 of the block 100, wherein the slave laser radiation 62, for example, enters the block 100 directly in the region of the end 102 and the array 10 is fixed in position in relation to the block 100.

Following a first reflection, the slave laser radiation 62 impinges on the Fourier optical device 681 designed as a diffractive optical element and, finally, following a further reflection on the phase corrector plate 76', likewise designed as a diffractive optical element.

Thereafter, the slave laser radiation 62 passes through the decoupling element 46' which is likewise designed as an element built into the block 100 in the region of an end 104.

In the same way, the master laser radiation 34 is guided in the block 100 and impinges on the optical collimation device 38', likewise designed as a diffractive optical element, and following several reflections enters the polarization prism 50 and is coupled by this into the optical transformation device 60', in the same way as that explained in conjunction with FIG. 1.

In a fourth embodiment of an inventive laser radiation source, illustrated in FIG. 12, the block 100' is designed in a subsection 106 as a block shaped like a parallelogram in its outer shape, wherein the two-dimensional array 10 of slave laser diodes $12_1$ to $12_N$ is arranged on a short side of the parallelogram.

The individual optical elements are likewise designed as diffractive optical elements in the same way as in the third embodiment.

The master laser radiation 34 of the master laser diode 30 is guided in the block 100' likewise offset in relation to the slave laser radiations 62 such that a coupling in is brought about via the polarization prism 50 of the decoupling element 46'.

As for the rest, the same elements are given the same reference numerals and so with respect to the description thereof reference can be made in full to the comments on the preceding embodiments.

In conjunction with the preceding explanations concerning the individual embodiments, no details have been given as to how the individual power supply networks $20_1$ to $20_N$ for the individual slave laser diodes $12_1$ to $12_N$ are intended to be designed.

In the simplest case—as illustrated in FIG. 13—the power supply networks $20_1$ to $20_N$ are resistors $110_1$ to $110_N$ which are connected in series to the respective slave laser diodes $12_1$ to $12_N$ and to the constant voltage source 22 via a supply line 112 while, on the other hand, the slave laser diodes $12_1$ to $12_N$ are, for their part, grounded.

In order to have the respective vertical emitters 120 operating with the same polarization transversely to the direction of propagation 150 of the laser radiation, these may be designed with respect to their cross sectional shape so as to deviate from a circular shape in planes at right angles to the direction of propagation 150. For example, the shape is oval or deviates on one side from a circular cross section. Alternatively, the direction of polarization can also be stabilized to a great extent as a result of suitable crystal orientation of the substrate.

Figure 15:
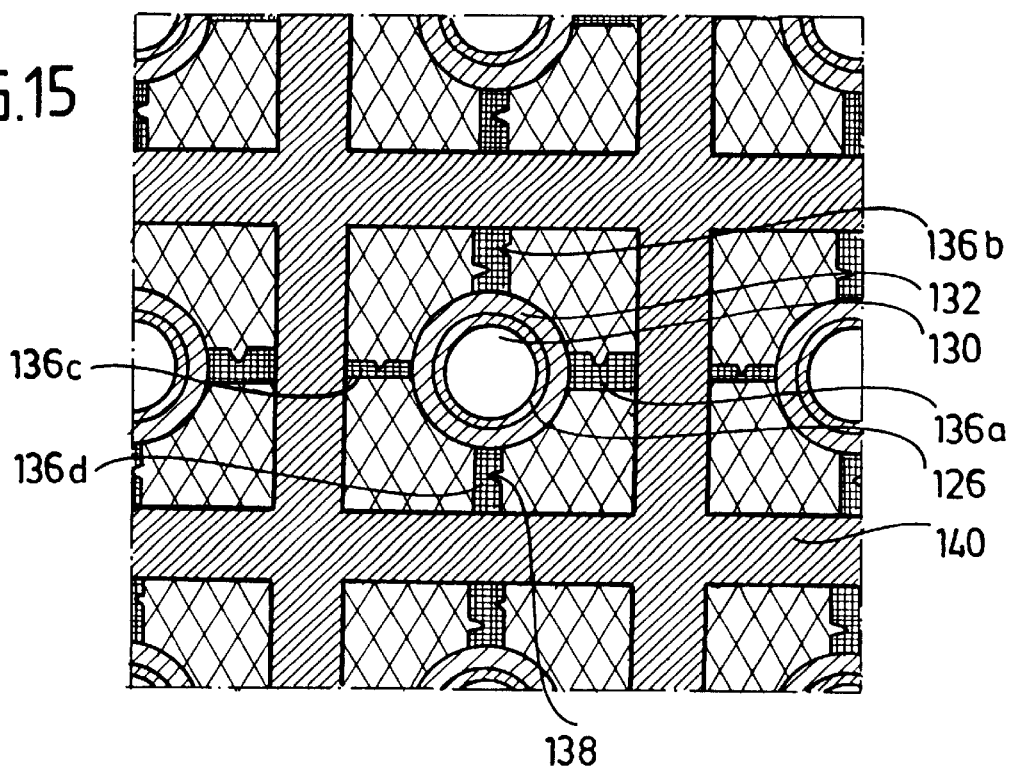
FIG. 15 shows a plan view of a substrate with vertical emitters in accordance with FIG. 14.

A power supply for the individual slave laser diodes $12_1$ to $12_N$ may, as illustrated in FIGS. 14 and 15, be realized in the case of vertical emitters 120 as laser diodes, in particular, as slave laser diodes 12 in that these vertical emitters 120 are arranged on the common substrate 14 which is, for its part, located on a common contact layer 122, wherein the common contact layer 122 represents the ground layer, via which each individual vertical emitter 120 is connected to earth through the substrate layer 14.

A supply of current to each individual vertical emitter 120 is brought about via a contact ring 126 which is placed on an uppermost layer 124 of the respective vertical emitter 120 and has an opening 128 which opens up an exit surface 130 for the respective laser radiation.

Each contact ring 126 of such a vertical emitter 120 is, for its part, contacted by an outer connecting ring 132 which surrounds the respective vertical emitter 120 and is preferably located on an insulation layer 134 surrounding it.

Adjustable line sections 136 lead to the outer contact ring 132 and these are located between the outer contact ring 132 and a network of intersecting path conductors 138 and 140 which are located on an insulation layer 141 extending between the individual vertical emitters 120.

Each outer ring 132 is preferably connected to the network of intersecting path conductors 138 and 140 by means of four line sections 136a, 136b, 136c and 136d, wherein the line sections 136a to 136d preferably have cross sections which are already different in their basic shape and together form the resistor 110 connected in series with the respective slave laser diode 12. All these line sections 136a to 136d can, for example, be trimmed by a laser beam, wherein the trimming is brought about by inserting recesses 138 into the line sections 136a to 136d, wherein these recesses 138 result in an additional reduction in cross section and thus an increase in resistance.

On account of the cross sections of the line sections 136a to 136d which are already different in their basic shape, different resistance variations can be achieved as a result of the introduction of the recesses 138 and so a rough or less rough fine tuning of the total resistance of all the line sections 136a to 136d can be achieved for a vertical emitter 120.

Figure 16:
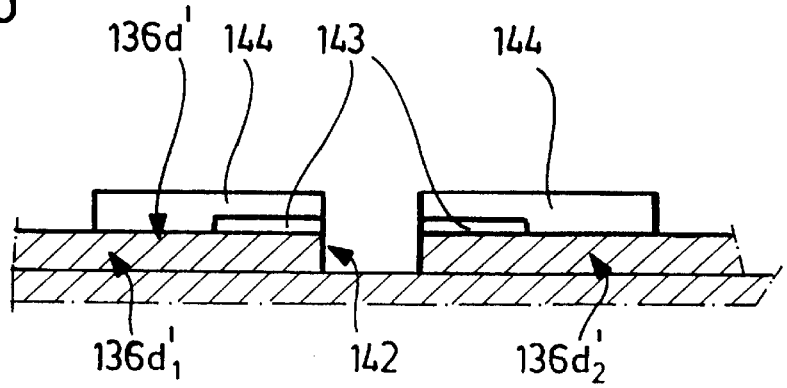
FIG. 16 shows a schematic illustration of a conductor section with an interruption.

In addition or alternatively to the reduction in the cross sections in the line sections 136a to 136d, it is, however, likewise conceivable to provide the line section 136d', for example, with an interruption 142 so that line section segments 136d'1 and 136d'2 result which do not carry current on account of the interruption 142 (FIG. 16).

Each of the line section segments 136d'1 and 136d'2 bears close to the interruption 142 a non-wettable layer 143 consisting, for example, of platinum and this is, on the other hand, covered by a solder layer 144.

Figure 17:
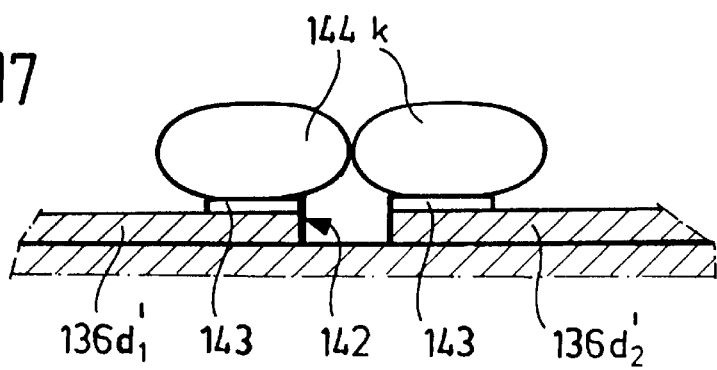
FIG. 17 shows a schematic illustration of the conductor section according to FIG. 16 with bridging of the interruption.

If the solder layer 144 is caused to melt due to the effect of heat, for example, by means of a laser beam, solder spheres 144k result, as illustrated in FIG. 17, on account of the non-wettability of the layer 143 and these solder spheres are in a position to bridge the interruption 142 so that current is then, altogether, conducted from the line section segment 136d'1 via the non-wettable layer 143, the touching solder spheres 144k, the non-wettable layer 143 to the line section segment 136d'2.

In this respect, the size of the solder spheres 144k can preferably be determined by thickness and extension of the solder layer 144 prior to its melting.

It is thus possible to configure the line section 136d', which is provided with the interruption 142 and has, first of all, the resistance infinite, so as to be conductive and thus reduce the resistance altogether, wherein this does not exclude the fact that the line section 136d' is likewise reduced with respect to its resistance again, for example, at a different location, again by inserting a recess 138.

The network of intersecting path conductors 138 and 140 is, as illustrated in FIG. 14, connected to the voltage source 22 which is preferably designed as a constant voltage source.

With such a supply of current to all the slave laser diodes $12_1$ to $12_N$, small fluctuations in the voltage of the voltage source 22 are unimportant since the current increases or decreases through all the slave laser diodes $12_1$ to $12_N$ in the same way and thus the relative adjustment of the slave laser diodes $12_1$ to $12_N$ remains the same.

Figure 18:
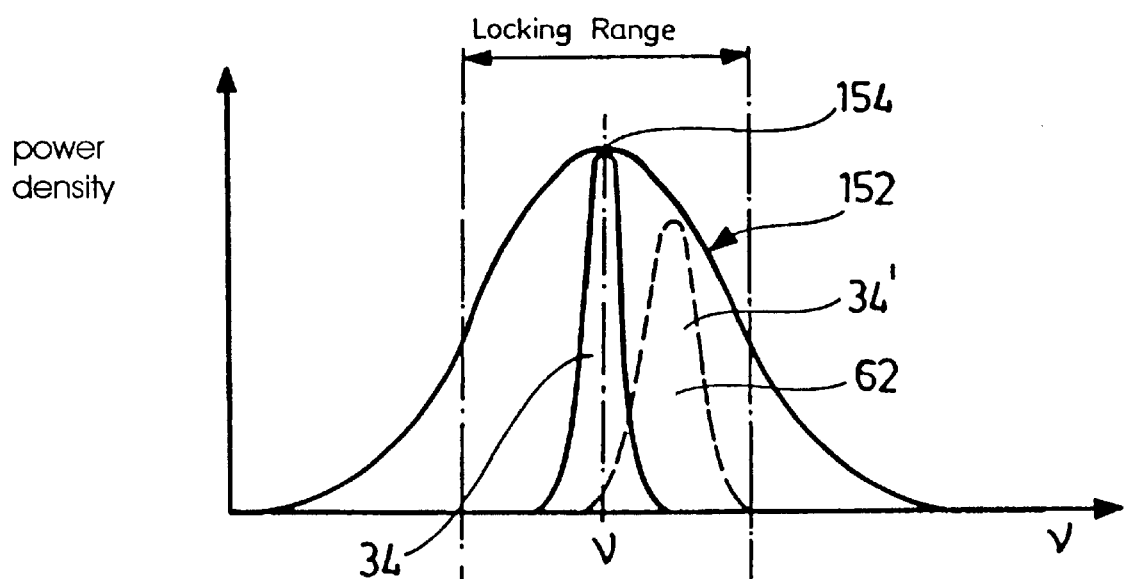
FIG. 18 shows a schematic illustration of a resonance curve of a vertical emitter in relation to the master laser radiation.

The adjustment of the current through the respective slave laser diode $12_1$ to $12_N$ now results, as illustrated in FIG. 18, in the optical path in the layer system 145, 146, 148 of the vertical emitter 120 varying in a direction of propagation 150 of the resulting slave laser radiation 62 and thus the resonance curve 152 of the optical resonator provided in the respective vertical emitter 120, as well, this being formed, for example, by Bragg gratings 146 and 148 designed as layers in the vertical emitter.

As a result, the resonance curve 152 of the respective resonator 146, 148 present in the vertical emitter 120 may be shifted to the frequency axis. If, for example, an adjustment of the respective vertical emitter 120 with the respective master laser radiation 34 is intended to take place, the resonance curve 152—as illustrated in FIG. 18—may be shifted, for example, such that the wavelength of the master laser radiation 34 is located essentially at the maximum point 154 of the resonance curve 152.

In this case, the frequency of the free-running slave laser diode 12 is identical to the frequency of the master laser diode 30.

There is, however, also the possibility of shifting the resonance curve 152 of the resonator 146, 148 relative to the master laser radiation 34 such that, as likewise illustrated in FIG. 18 by the master laser radiation 34', the master laser radiation 34' is located next to the maximum point 154. This is possible as long as the relative shift is so small that the master laser radiation 34' is still located within an operating range or "locking range" of the resonance curve 152.

Figure 19:
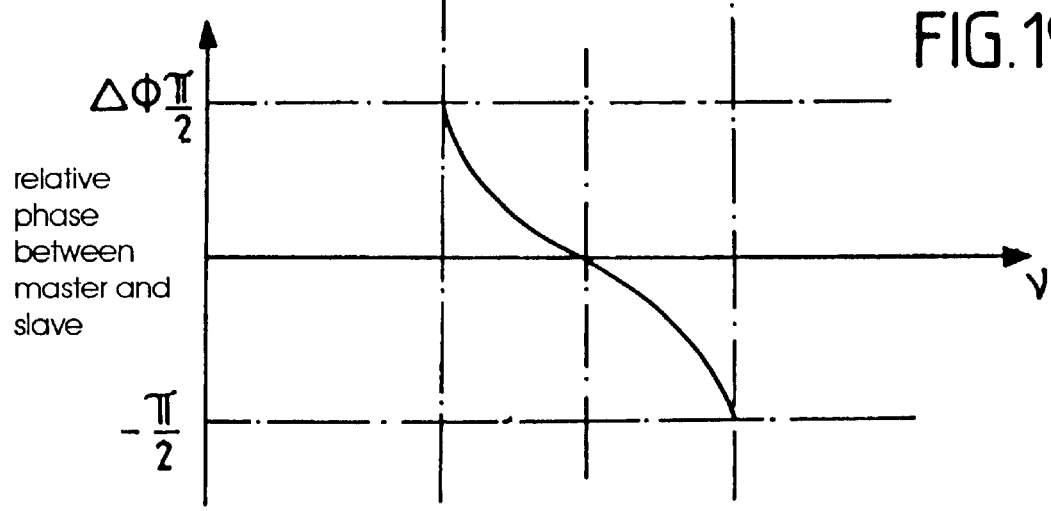
FIG. 19 shows a schematic illustration of a relative phase relationship between master laser radiation and slave laser radiation as a function of the position of the master laser radiation relative to the resonance curve of the slave laser diode.

As a result, as illustrated in FIG. 19, the relative phase relationship between the master laser radiation 34 and the slave laser radiation 62 may be adjusted.

If, for example, in the case of one of the vertical emitters 120 the phase relationship of the slave laser radiation 62 is to be varied relative to the master laser radiation 34, which is identical with respect to its frequency in the case of all the vertical emitters 120, the resonance curve 152 in the case of this vertical emitter 120 is shifted by way of adjustment of the current to such an extent until the slave laser diode 12 operates with the desired phase difference relative to the master laser radiation 34 and, consequently, the slave laser radiation 62 also has this phase difference, wherein the frequency of the master laser radiation 34 is still the same in the case of all the vertical emitters 120 and thus all the vertical emitters 120 operate at the frequency of the master laser radiation 34.

Thus, an exact adjustment of the phase relationship of all the slave laser diodes $12_1$ to $12_N$ relative to one another may be achieved in order to be able to obtain a coherent in-phase superposition of all the slave laser radiations 62 in the total laser radiation field 64.

With such an adjustment of the phase relationship of the respective vertical emitter 120 phase shifts, in particular, may likewise be compensated for by subsequent optical components, in particular, the optical transformation device 60 with the phase plate 72 and the phase corrector plate 76.

The relative phase relationship of the individual slave laser diodes $12_1$ to $12_N$ may thereby be adjusted, for example, due to the fact that during operation of all the slave laser diodes $12_1$ to $12_N$ at the frequency of the master laser radiation 34, i.e. with an operating master laser diode 30, the intensity of the focused total laser radiation field 64 is measured and maximized each time from only two of the slave laser diodes $12_1$ to $12_N$. In this respect, one of the slave laser diodes $12_1$ to $12_N$ is used as a reference, for example, the slave laser diode $12_1$ and all the remaining slave laser diodes $12_2$ to $12_N$ are adjusted to this slave laser diode $12_1$ operating as reference with respect to their phase relationship, for example, such that the reference slave laser diode $12_1$ and a respective one of the remaining slave laser diodes $12_2$ to $12_N$ are operated with the master laser radiation 34 and only their intensity in the focused total laser radiation field 64 is measured. If the intensity is at a maximum, the phases of the two slave laser radiations $62_1$ and $62_{2-N}$ correspond to one another.

The adjustment of the respectively corresponding resistor of the resistors $110_2$ to $110_N$ is brought about each time for such a time until an in-phase superposition of the two respective slave laser radiations 62 is reached.

Figure 20:
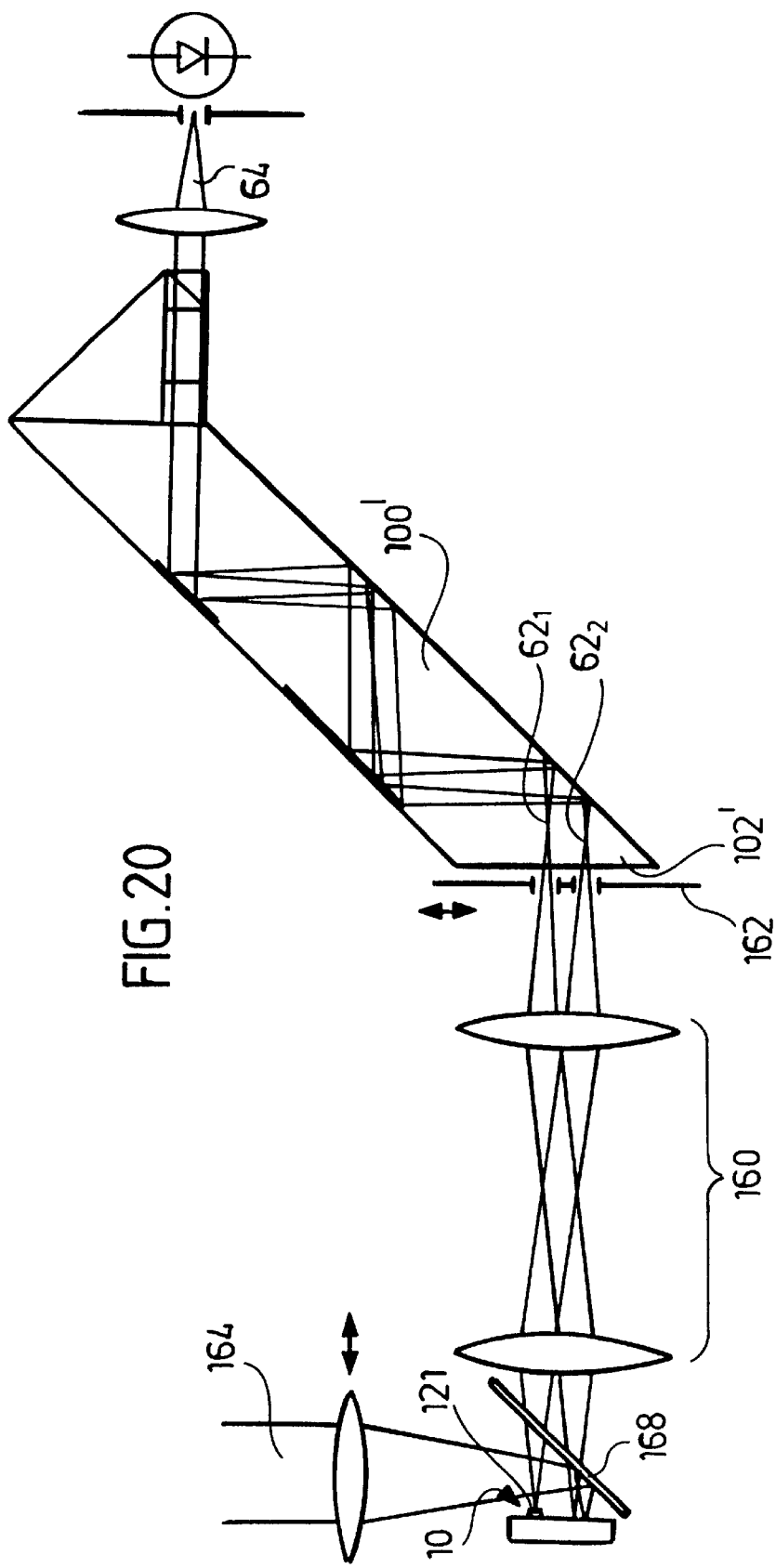
FIG. 20 shows a schematic illustration of an adjustment process of the individual slave laser diodes relative to one another in the case of the fourth embodiment.

One possibility of carrying out such an adjustment is illustrated by way of example in FIG. 20 on the basis of the fourth embodiment. For the adjustment, the array 10 of slave laser diodes $12_1$ to $12_N$ is arranged laterally inverted at a distance from the corresponding surface of the block 100' and imaged via an intermediate optical imaging device 160 as if the array 10 were abutting directly on the block 100' in the region of the end 102'.

As a result of the intermediate optical imaging device 160 it is possible, for example, with a diaphragm 162 to select two slave laser radiations each time, for example, the slave laser radiation $62_1$ and the slave laser radiation $62_2$ and to mask out the remaining slave laser radiations $62_3$ to $62_N$. At the same time, care is, however, taken that the master laser radiation 34 still maintains both slave laser diodes $12_1$ and $12_2$ at the same frequency.

For the adjustment, it is now possible on account of the intermediate optical imaging device 160 to direct an adjusting laser beam 164 by means of a semi-transparent mirror 168 onto the respective slave laser diodes 12, in this case the slave laser diode $12_2$, in order to introduce recesses 138 into one of the line sections 136a to 136d and/or to bridge an interruption 142 in the line section 136d' and thus adjust the slave laser diode $12_2$, namely such that the focused total laser radiation field 64 displays a maximum intensity.

The procedure with the remaining slave laser diodes $12_3$ to $12_N$ is then the same so that after completion of the adjustment process all the slave laser diodes $12_2$ to $12_N$ are adjusted to the reference slave laser diode $12_1$ and operate in phase with it.

As a result of the independent master power supply 32 it is, in addition, possible to minimize the intensity of the total laser radiation 64 by varying the current supplied to the master laser diode 30, wherein the alteration in current can be very slight since a slight variation in current is sufficient to either shift the frequency of the master laser radiation 34 to such an extent that this is located outside the resonance curves 152 of all the slave laser diodes $12_1$ to $12_N$ so that the slave laser diodes $12_1$ to $12_N$ no longer operate at the same frequency and thus a coherent superposition of all the slave laser radiations 62 to form the total laser radiation field no longer takes place. As a result, the intensity of the total laser radiation field 64 crashes.

It is, however, also possible to vary the current for the master laser diode 30 to such an extent that this no longer emits any master laser radiation 34 and thus all the slave laser diodes $12_1$ to $12_N$ likewise no longer operate at the same frequency.

The inventive solution thus offers the simple possibility of already achieving a high modulation depth in the intensity of the total laser radiation field 64 by way of slight variations in the current.

With respect to the design of the phase plate 72 and the corresponding complementary design of the phase corrector plate 76, no further details have been given in conjunction with the preceding explanations concerning the individual embodiments. It would, for example, be conceivable to design the phase plate 72 such that the individual slave laser radiations 62 are given a statistically varying different phase.

In order to achieve a high efficiency in the total laser radiation field 64, it has, however, proven to be particularly advantageous when the phase plate 72 is designed such that the phase, as illustrated in FIG. 21, varies as a monotonic analytical function proceeding from a central area to edge areas, namely in all directions, wherein a central slave laser diode $12_N$ of the array 10 serves as a reference, proceeding from which the phase differences increase quadratically, for example, due to the function $$\varphi = \frac{\pi \cdot ((i - i0)^2 + (j - j0)^2)}{\sqrt{N}},$$

wherein i0 and j0 represent the coordinates of the central slave laser diode $12_M$ and i and j the coordinates of the respective slave laser diode 12.

These phase differences, when they exceed the value $2\pi$, can be corrected in that the value $2\pi$ is deducted in this case so that the pattern illustrated in FIG. 22 results, for example, in the thickness of the phase plate 72 for the individual slave laser radiations 62 which supplies the desired phase relationship between the individual slave laser radiations 62.

What is claimed is:

1. A laser radiation source comprising:
    an array of N individual slave laser diodes in a predetermined surface area,
    a slave power supply for the slave laser diodes for generating slave laser radiation,
    said slave power supply having a separate power supply network for each slave laser diode,
    each of said power supply networks being adjustable with respect to current supplied to the respective slave laser diode during a certain operating period for adjusting the slave laser diodes relative to one another,
    said power supply networks being connected in parallel and being supplied by a common power source,
    a master laser diode for generating a master laser radiation,
    an optical coupling device for coupling the master laser radiation into the individual slave laser diodes in order to operate them at the frequency of the master laser diode in a phase-locked manner,
    said optical coupling device comprising a decoupling element in the optical path from said master laser to each of said slave laser diodes to prevent out coupling said slave laser radiation to said master laser diode, and
    an optical transformation device to combine the slave laser radiation of the individual slave laser diodes to form a coherent total laser radiation field with essentially plane wave fronts.

2. A laser radiation source as defined in claim 1, wherein each of the power supply networks is adjustable one time.

3. A laser radiation source as defined in claim 1, wherein each of the power supply networks is a resistance network.

4. A laser radiation source as defined in claim 3, wherein each of the power supply networks has a resistor which is adjustable due to alteration of a cross section thereof.

5. A laser radiation source as defined in claim 3, wherein each of the power supply networks has an adjustable resistor connected in series with the respective slave laser diode.

6. A laser radiation source as defined in claim 1, wherein all the power supply networks are supplied by a common voltage source.

7. A laser radiation source as defined in claim 1, further comprising a master power supply for the master laser diodes.

8. A laser radiation source as defined in claim 7, wherein the slave power supply operates independently of the master power supply.

9. A laser radiation source as defined in claim 7, wherein the master power supply is adjustable.

10. A laser radiation source as defined in claim 7, wherein the master power supply is controllable with respect to the current through the master laser diode.

11. A laser radiation source as defined in claim 1, wherein all the slave laser diodes are arranged on a common support.

12. A laser radiation source as defined in claim 11, wherein said common support comprises a substrate.

13. A laser radiation source as defined in claim 11, wherein the power supply of the slave laser diodes is brought about by way of path conductors extending on the support.

14. A laser radiation source as defined in claim 11, wherein the power supply networks are arranged on the support.

15. A laser radiation source as defined in claim 14, wherein a power supply network is associated with each slave laser diode, said network being arranged on the support in the area of said diode.

16. A laser radiation source as defined in claim 15, wherein the power supply network has conductor sections arranged on the support and adjustable with respect to resistance.

17. A laser radiation source as defined in claim 16, wherein the conductor sections are adjustable by way of variation of a cross section thereof.

18. A laser radiation source as defined in claim 1, wherein each of the power supply networks is adjustable by way of laser trimming.

19. A laser radiation source as defined in claim 1, wherein each of the slave laser diodes is designed with respect to its operating range as a slave laser diode such that a resonator frequency of the slave laser diode is adjustable via current adjustment.

20. A laser radiation source as defined in claim 1, wherein a phase relationship of the slave laser radiation of each slave laser diode relative to the master laser radiation is adjustable via current adjustment.

21. A laser radiation source as defined in claim 11, wherein the slave laser diodes are arranged in a two-dimensional array.

22. A laser radiation source as defined in claim 21, wherein the two-dimensional array has in each dimension an extension of approximately the same order of magnitude.

23. A laser radiation source as defined in claim 11, wherein the slave laser diodes and the master laser diode are seated on the same support.

24. A laser radiation source as defined in claim 11, wherein the slave laser diodes and the master laser diode are seated on the same substrate.

25. A laser radiation source as defined in claim 23, wherein one of the laser diodes of a continuous array represents the master laser diode and the other laser diodes operate as slave laser diodes.

26. A laser radiation source as defined in claim 11, wherein the laser diodes are arranged on a single, continuous substrate as vertical emitters.

27. A laser radiation source as defined in claim 1, wherein the optical transformation device comprises a microlens array.

28. A laser radiation source as defined in claim 1, wherein the optical transformation device:
    has a phase plate altering the phase of the slave laser radiation in such a manner that a defined distribution of intensity results in an additional plane, and
    comprises a phase corrector plate in the additional plane adjusted to the phase plate and leading to a defined wave front in the exiting total laser radiation field.

29. A laser radiation source as defined in claim 1, wherein the optical transformation device:
    has a phase plate giving each slave laser radiation of a slave laser diode a different phase, and
    comprises a Fourier optical device, a phase corrector plate adjusted to the phase plate being arranged in the Fourier plane of said Fourier optical device,
    said phase corrector plate leading to a plane wave front in the exiting total laser radiation field.

30. A laser radiation source as defined in claim 28, wherein the phase plate is shaped to shift the phase between the slave laser radiation provided by different slave laser diodes.

31. A laser radiation source as defined in claim 30, wherein the phase plate effects a phase relationship varying in the same manner in all directions proceeding from a center point.

32. A laser radiation source as defined in claim 31, wherein the variation in the phase relationship is brought about in accordance with a monotonic analytical function.

33. A laser radiation source as defined in claim 1, wherein the master laser radiation is adapted to be coupled into the slave laser diodes via the optical transformation device by means of the optical coupling device.

34. A laser radiation source as defined in claim 28, wherein the master laser radiation passes through the phase corrector plate and the phase plate.

35. A laser radiation source as defined in claim 1, wherein the optical transformation device is integrated into a coherent block.

36. A laser radiation source as defined in claim 35, wherein optical elements of the optical transformation device comprise diffractive optics.

37. A laser radiation source as defined in claim 35, wherein the optical coupling device is integrated into said block.

38. A process for operating a laser radiation source, said source having (i) an array of N individual slave laser diodes for generating slave laser radiation, and (ii) a master laser diode for generating a master laser radiation, comprising the steps of:
    optically coupling the master laser radiation into the individual slave laser diodes via an optical coupling device in order to operate the slave laser diodes at the frequency of the master laser diode in a phase-locked manner,
    preventing out coupling of said slave laser radiation to the master laser diode,
    forming a coherent total laser radiation field with essentially plane wave fronts from the slave laser radiation of the individual slave laser diodes via an optical transformation device, and
    individually adjusting the current supplied to each individual slave laser diode during a certain operating period to adjust the slave laser diodes relative to one another, such that the slave laser radiation from the diodes is superimposed coherently in the total laser radiation field with the same phase.

39. A process as defined in claim 38, wherein the current for each individual slave laser diode is adjusted one time.

40. A process as defined in claim 38, wherein the slave laser diodes are operated independently of the master laser diode.

41. A process as defined in claim 38, wherein the total laser radiation field is adapted to be modulated with respect to its intensity with the master laser diode.

42. A process as defined in claim 41, wherein the master laser radiation is adapted to be modulated by way of the current supplied to the master laser diode.

43. A process as defined in claim 38, wherein all the slave laser diodes are operated under essentially identical temperature conditions.

44. A process as defined in claim 43, wherein the slave laser diodes and the master laser diode are operated under essentially identical temperature conditions.

45. A process as defined in claim 38, wherein each of the slave laser diodes is designed with respect to its operating range as a slave laser diode such that a resonator frequency of the slave laser diode is adjusted by way of adjustment of the current.

46. A process as defined in claim 38, wherein a phase relationship of the slave laser radiation of each slave laser diode relative to the master laser radiation is adjusted by current adjustment.

* * * * *